United States Patent [19]

Alapat

[11] Patent Number: 5,459,733
[45] Date of Patent: Oct. 17, 1995

[54] INPUT/OUTPUT CHECKER FOR A MEMORY ARRAY

[75] Inventor: Varkey P. Alapat, Sunnyvale, Calif.

[73] Assignee: National Semiconductor Corporation, Santa Clara, Calif.

[21] Appl. No.: 247,536

[22] Filed: May 23, 1994

Related U.S. Application Data

[63] Continuation of Ser. No. 854,157, Mar. 20, 1992, abandoned.

[51] Int. Cl.$^6$ .................................................. G11C 29/00
[52] U.S. Cl. .................. 371/21.1; 364/964.4; 364/964.3; 364/243.5
[58] Field of Search ...................................... 371/21.1, 2.2, 371/10.1, 10.3, 15.1, 16.1, 22.2, 25.1, 40.1, 40.4; 364/244.6, 244.9, 243.3, 243.5, 964, 964.3, 964.4, 964.5, 965, 965.1, 965.2, 965.3, 965.8; 365/201, 185

[56] References Cited

U.S. PATENT DOCUMENTS

| | | | |
|---|---|---|---|
| 4,267,583 | 5/1981 | Suzuki | 365/201 |
| 4,701,886 | 10/1987 | Sakakibara et al. | 365/189 |
| 4,858,190 | 8/1989 | Yamaguchi et al. | 365/189.05 |
| 4,879,688 | 11/1989 | Turner et al. | 365/201 |
| 4,882,702 | 11/1989 | Struger et al. | 364/900 |
| 4,969,121 | 11/1990 | Chan et al. | 364/900 |

OTHER PUBLICATIONS

Pawlowski, M., et al., "Functional Testing of EPROM's" *IEEE J. of Solid–State Circuits,* 19(2):212–218 (1979).
Kondo, R., "Test Patterns for EPROMS" *IEEE J. of Solid–State Circuits* 14(4):730–734 (1979).
Kondo, R., et al., "An Erase Model in Double Poly–Si Gaten–Channel FAMOS Devices" *IEEE Transactions on Electron Devices,* 25(3):369–374 (1978).
Yu, P. N., "Bitmapping: A Tool for EPROM Failure Analysis", *IPFA Symposium Proceeds* pp. 32–37 (1987).
Morandi, C., et al., "On the Use of Matrix Algebra for the Description of EPROM Failures"., *IEEE J. of Solid–State Circuits* 16(2):107–109 (1981).
Suk, D. S., et al., "A March Test for Functional Faults in Semiconductor Random Access Memories", *IEEE Transactions on Computers,* 30(12):982–985 (1981).
Fuchs, W. K. et al., "A Unified Approach to Concurrent Error Detection in Highly Structured Logic Arrays" *IEEE* pp. 4–9 (1984).
Sridhar, T., "A New Parallel Test Approach for Large Memories" *IEEE,* Paper 13.5 pp. 462–470 (1985).
Marinescu, M., "Simple and Efficient Algorithms for Functional RAM Testing", *IEEE* Paper 10.2 pp. 236–239 (1982).
Mak, G. P., et al., *"The Design of Plas with Concurrent Error Detection",* pp. 303–310 (1982).
Cocking, J., "Ram Test Patterns and Test Strategy", pp. 1–7.
Barnes, J. J., et al., "Operation and Characterization of N–channel EPROM Cells" *Solid–State Electronics,*

(List continued on next page.)

*Primary Examiner*—Robert W. Beausoliel, Jr.
*Assistant Examiner*—Dieu-Minh Le
*Attorney, Agent, or Firm*—Townsend and Townsend Khourie and Crew

[57] ABSTRACT

A memory array such as an EPROM device includes circuitry that permits testing of a I/O portion of the device without writing data to the EPROM. A data program block that applies a data dependent high voltage pulse to a selected column line for programming can be set to programming or test mode. In the normal, or programming mode, the data input to the data program block is output to the EPROM memory array as is normally required to write to the device. In the test mode, the data output from the data program block controllably connects or decouples the array input line to ground depending upon a binary state of the the input signal. A test output is evaluated using the same sense amp used to evaluate data read from a memory cells of the EPROM array during normal read operations. To prevent writing to the memory cells of the memory array during test, the programming voltage supply is prevented from being applied to a selected column line and all rows in the memory array are deselected simultaneously.

14 Claims, 7 Drawing Sheets

OTHER PUBLICATIONS

21:521–529 (1978).

"Random Access Memory" pp. 355–362.

Pawlowski et al., "Functional Testing of EPROMs", *IEEE Journal of Solid–State Circuits*, vol. SC–19, No. 2, Apr., 1984.

Fuchs, et al., "A Unified Approach to Concurrent Error Detection in Highly Structured Logic Arrays", 16th FTCS, Kissemmee, USA, 1984.

Marinescu, "Simple and Efficient Algorithms for Functional RAM Testing," 1985 Test Conference.

CMS Subsystem Design, pp. 355–362.

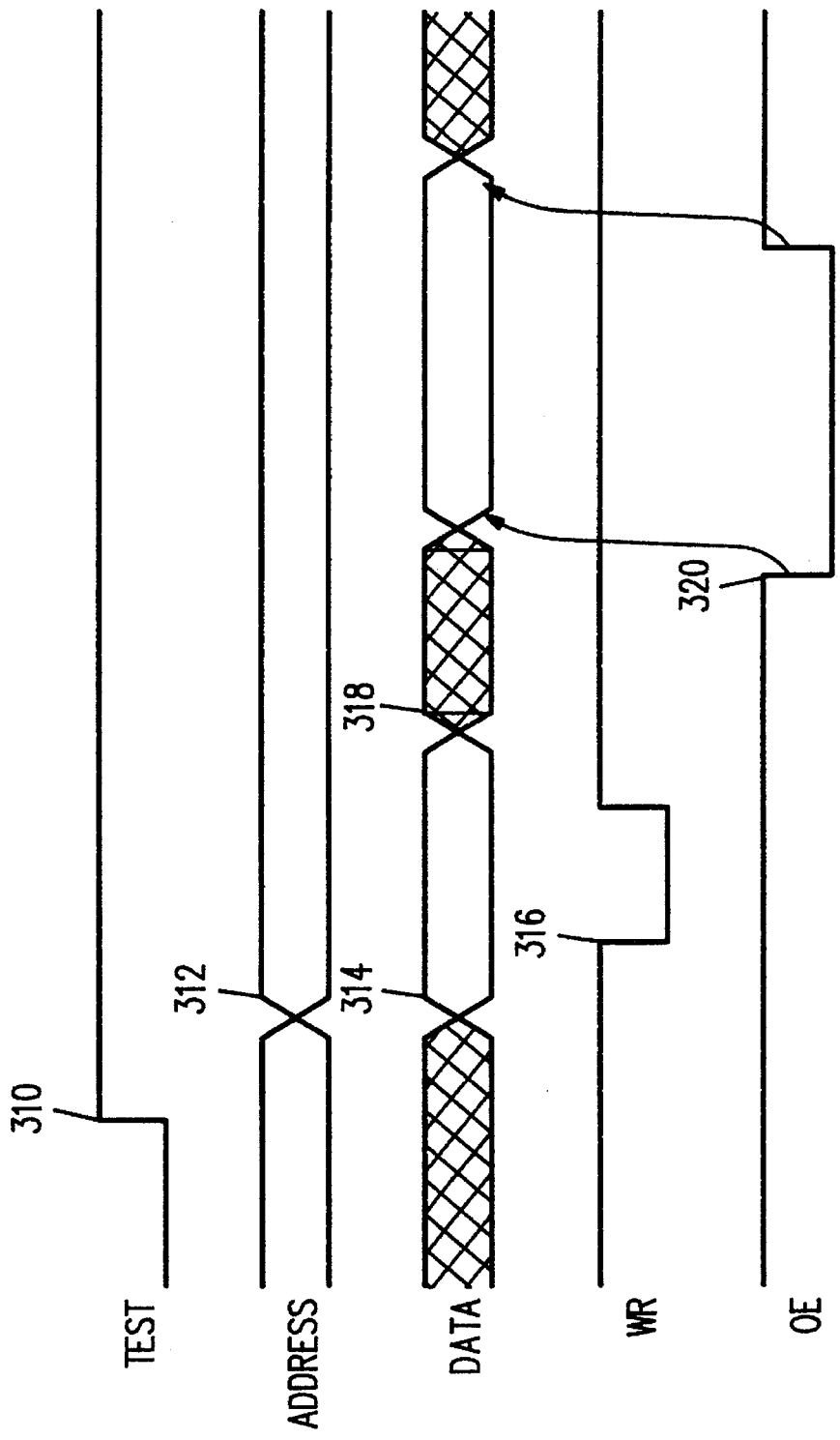

5,459,733

INPUT/OUTPUT CHECKER FOR A MEMORY ARRAY

This is a Continuation of application Ser. No. 07/854,157, filed Mar. 20, 1992, now abandoned.

BACKGROUND OF THE INVENTION

The present invention relates to an apparatus and method for checking for faults in the input/output portion of a memory device and in particular to an apparatus and method for checking programmable read only memories to locate hardware faults.

In the manufacture of memory devices, it is typically desired to test the memory devices for faults before delivering or selling the memory devices. One type of memory which is typically tested is read only memory. This is a memory which is designed so that, in normal use, its contents can be read but cannot be written to or changed. A programmable read only memory (PROM) is a memory which, typically, can be written to once, i.e., in which it is possible to electronically change the state of a given memory cell (i.e., the unit of memory which is in either a first or second state, storing a "1" or a "0") from its erased state to the opposite state but in which a subsequent erasing of the programmed memory cell is not done during normal operation (other than EEPROMs). The writing of data to a cell of the PROM is called "programming". Typically, a PROM cell is programmed using voltages higher than those used in addressing and reading a cell.

One class of PROMs permits erasing of programmed cells but requires special procedures for erasing and thus does not permit erasing during normal, routine use of the memory. These memories are referred to as an erasable programmable read only memories (EPROM). In some types of EPROMs, data programmed or stored in the memory can be erased by exposing the cells to light, typically ultraviolet light. These memories are manufactured in a package which includes a window, typically a quartz window, to permit transmission of ultraviolet light. Windowed EPROMs are particularly useful during development because the memory can be reprogrammed to correct programming errors and the like. One difficulty with windowed EPROMs is the relatively high cost of producing the windowed packages. So it is economically advantageous to substitute windowless EPROMs, for windowed EPROMs, in products, after the software development phase is completed. Windowless EPROMs are sometimes referred to as one-time programmable (OTP) EPROMs. This term is something of a misnomer, since being windowless, the memory, once packaged, is not erasable.

Array devices that have an array of memory cells such as read only memories are sold as stand-alone chips, as well as being provided on chips which include circuitry in addition to the memory block. This additional circuitry may include data input devices and data output devices associated with the memory, other than standard data input and data output pins. See FIG. 9. In general, input circuitry refers to the Input Device Block 510 and Memory Input Datapath 512. Input Device Block 510 refers to the on-chip input devices which provide data to be written to the EPROM 514 (for example, Universal Asynchronous Receiver-Transmitter (UART), input pins, input register, etc.). Memory Input Datapath 512 selects and receives the data, and sends it to the array through bitlines 516 for the purpose of writing the data into array (which for an EPROM can include multiplexers (mux), an internal data input bus, a Data Program Block, etc.). In general, Data Output Circuitry refers to the Output Device Block 518 and Memory Output Datapath 522. Output Device Block refers to the on-chip output devices receiving data read from the EPROM 514 (such as data output pins, UART, etc.). Memory Output Datapath 522 receives the data being read out from the memory array, transfers to the internal data output bus of the memory, and selects and sends data to an output device 518. Memory Output Datapath for an EPROM can include an internal data output bus, sense amps, drivers, etc. EPROMs, for example, can include an input circuit which receives data through its input pins from an external data bus, in a manner well known in the art. Similarly, EPROMs can include an output circuit which during a read receives data from the array and outputs data through its output pins to an external databus, in a manner well known in the art. EPROMs can also be provided on multi-function or general function chips as an embedded EPROM. In this case, the EPROM input and output circuits may receive and output data from and to an on-chip bus, and there could be multiple input devices and output devices connected to this on-chip bus, as described above. In any case, it is often desired to determine whether the input/output circuitry associated with the EPROM is properly functioning. FIG. 9 shows Input Device Block 510, Memory Input Datapath 512, Output Device Block 518, and Memory Output Datapath 522 for a general case of a microcontroller with embedded EPROM 524. In some cases, at least some of the data input devices and data output devices are included in the input/output circuitry which needs to be tested using this apparatus and method. Thus, associated input/output circuitry refers to the part of memory input/output datapath and input/output devices testable using the methodology described here.

In the special case of OTP EPROMs, there are certain difficulties in testing the I/O circuitry. This can best be understood by describing how the testing of I/O circuits in normal or "windowed" EPROMs is conducted. Although a number of testing methodologies for I/O circuits of windowed EPROMs are available, the testing used according to previous schemes has involved writing data to at least some of the memory cells in the normally-used array. This can be done in the context of windowed EPROMs, since, following such a programming of cells in the array, the EPROM can be erased to permit the desired final programming to be placed into the memory array. Even with windowed EPROMs, this procedure has the undesirable characteristic that erasing the arrays can be undesirably time-consuming.

This type for testing is infeasible of OTP devices since cells that are programmed for a testing purpose cannot thereafter be erased to permit insertion of the desired program into the memory. In many commercially available OTP EPROMs, a number of additional EPROM cells are provided, in addition to the normal array. These additional cells are not accessed during normal operation, and, are exclusively for the purpose of testing certain functions including functions of the input/output circuit. This approach, however, has the limitation that the input circuit test cannot be fully repeated using the same set of additional cells, since it depends on programming the additional cells which cannot, thereafter, be erased. Also, using this approach, for an output circuit test, a large number of additional EPROM cells may be needed, depending on the output circuit to be tested. Because the input circuit testing is not fully repeatable it cannot be used to, for example, do an initial test, to subject the part to a dynamic life test or, for example, temperature or electronic environmental stresses, and subsequently perform another input circuit test. Furthermore, additional rows and columns used only for testing purposes reduce the area of the chip available for normal function memory and raises the cost of the device.

The problem is particularly acute in complex circuits, such as micro-controllers or other IC's with embedded EPROMs. Whereas simple EPROM chips, in which data pins are the only source of data, can be checked by, for example, writing and reading Reed-Muller codes and their negations as described in "Functional Testing of EPROMs," Pawlowski, et al., *IEEE Journal of Solid State Circuits*, V. SC-19, No. 2, April, 1984, complex IC's with embedded EPROMs having multiple sources of data typically require much more complex data test patterns. Thus, in devices where the data cannot be erased, such complex test patterns require providing a large number of extra memory cells adding to the cost of the EPROM array. Complexity of the necessary test data patterns can arise from such factors as the multiplicity and complexity of the data input and output devices. Complex data input and output circuits require complex patterns to detect functional faults. A number of test patterns may be needed to write and read data test patterns at different temperatures, voltages, frequencies, etc. to fully evaluate a complex circuit.

Accordingly, it would be useful to provide a test for OTP EPROM to detect as many I/O circuit faults as feasible without requiring additional rows and columns dedicated to these tests. It would also be useful to provide an OTP EPROM in which as much I/O circuit testing as feasible can be repeatable without having to write to any EPROM cells, even for a first time.

SUMMARY OF THE INVENTION

The present invention provides an architecture for an OTP EPROM and a methodology for using that architecture to conduct repeatable I/O circuit functional tests which do not require programming or writing to a cell as part of the testing procedure, even for a first time. Because these I/O circuits tests are conducted without programming a memory cell even for a first time, these tests are repeatable without erasing a cell.

According to one embodiment, the I/O circuitry includes a Data Program Block. In normal operation, the Data Program Block has the capability of providing high-voltage write data to the EPROM over a memory input line. According to this embodiment of the invention, the Data Program Block can be configured in a test mode. When the Data Program Block is in a test mode, data which is input from the input circuit is not written to the EPROM array. Instead, data which is provided by the input circuit is output from the Data Program Block in such a fashion that the output can be evaluated without writing the output to the EPROM array. In one embodiment, when the Data Program Block is in test mode, data provided by the input circuit is output on a "pseudo-write" line. The "pseudo-write" line is connected to the EPROM sense amp such that data in one binary state, (e.g., a binary "high" or "one") causes the sense amp bitline to be coupled to ground voltage and data of the other binary state (a "low" or "0" output) does not cause such a coupling of the sense amp bitline to ground. This results in a floating bitline, presenting the situation of reading a programmed cell in the array, to the sense amplifier. Since the sense amp is configured to determine whether the bitline has been coupled to ground, the sense amp can evaluate the data which is output over the pseudo-write line. This evaluated data can then be used to determine whether the data which is output by the output circuit bears the desired relationship to the data which was input to the input circuit. It is desired that data output from the output circuit should be the expected output data for the input applied to the input circuit. In one embodiment, the expected output data is identical to the applied input.

In one embodiment of the invention, a circuit supplies data to a first data line. In the trivial case, this circuit will be a data input pin with the associated input circuitry. A second circuit (data program block) receives the data from the first circuit and also receives a write-signal and a test-signal. The second circuit provides the data which it receives to at least a memory line. In a first configuration of the write signal and the test signal, data provided to the bitline can be written to elements in the EPROM array. However, in a different configuration of the write signal and/or test signal, the second circuit prevents writing of data to the EPROM array. Instead, data which is output by the second circuit is evaluated by a third circuit such as a sense amp, and outputs to a fourth circuit. In the trivial case, the fourth circuitry will be the data output pin and the associated circuitry.

In one embodiment of the invention, a circuit which includes an EPROM has the memory elements of the EPROM arranged in a plurality of rows and columns with the elements in each row connected to a row line and the elements in each column connected to a column line. A row decoder is coupled to each of the row lines for controllably selecting at least one row by placing the predetermined voltage on the row line. A column decoder is coupled to each of the columns for controllably selecting at least one column by connecting the column line to a sense amp bitline. The elements of the EPROM array that are programmable can be programmed by inputting a high voltage on the bitline during a time when a column line is selected and when a row line is write-selected, i.e., has been charged to a predetermined (e.g., high) voltage. An input circuit receives data from one of a plurality of sources and sends the data to its circuit block, called Data Program block. The circuit block can be configured in at least two modes. In a first mode, depending on the logic level of the data bit which is provided to the Data Program block, a signal is output on NDPGM 52 at a voltage level required to control the gating of a voltage to the bitline, which permits writing the data to the memory (when a row is write-selected). In the other mode, the circuit block outputs the received data to a device coupled to the bitline which connects the bitline to ground voltage only when said data is in a first binary state. The sense amp of the output circuit senses the state of the bitline (whether it is grounded or not) and outputs the data.

According to one embodiment of the invention, input/output devices coupled to an EPROM are tested by first write-deselecting all memory elements in the EPROM. This is typically achieved by deselecting the row lines, using the row decoder to pull all row lines (including the row line being addressed) to a "0" or deselected state, as described more fully below. Predetermined test data is provided from at least one of a plurality of input devices from Input Device Block 510, as shown in FIG. 9. The provided data is received by the Memory Input Datapath 512. The data is used to set the state of the bitlines 516 (grounded or not). The state of the bitlines are evaluated by the output circuit and output through an output device in Output Device Block 518. According to one embodiment of the invention, functional tests are conducted in order to test as much of the Input Device Block 510, Memory Input Datapath 512, Memory Output Datapath 522 and Output Device Block 518 as feasible depending on the type of devices and circuits, without writing to any EPROM cell. Certain sections of the datapaths, such as a Data Program Block, and certain types of input/output devices may only be either paritally testable or untestable using the new methodology. In packaged OTP EPROMs for circuits such as the Data Program Block, complete functional testing needs dedicated EPROM test cells. In this application, "I/O circuit test" refers to test for input/output devices and datapaths to uncover as many faults as feasible using this methodology, depending on the type of devices and circuits, without writing to any EPROM cell even for a first time. Parametric tests, such as EPROM access time, and programming voltage levels will not be tested using this methodology. The data output through the output device of the chip is provided to a tester for comparing with the data input by the tester. This comparison will indicate whether the input and output circuit and/or devices are functioning as desired. The outputting of data from the chip occurs without writing the data to the EPROM.

BRIEF DESCRIPTION OF THE DRAWINGS

FIG. 6A–6E show the timing relationship of the test signal and other signals;

DETAILED DESCRIPTION OF THE PREFERRED EMBODIMENT

Figure 1:
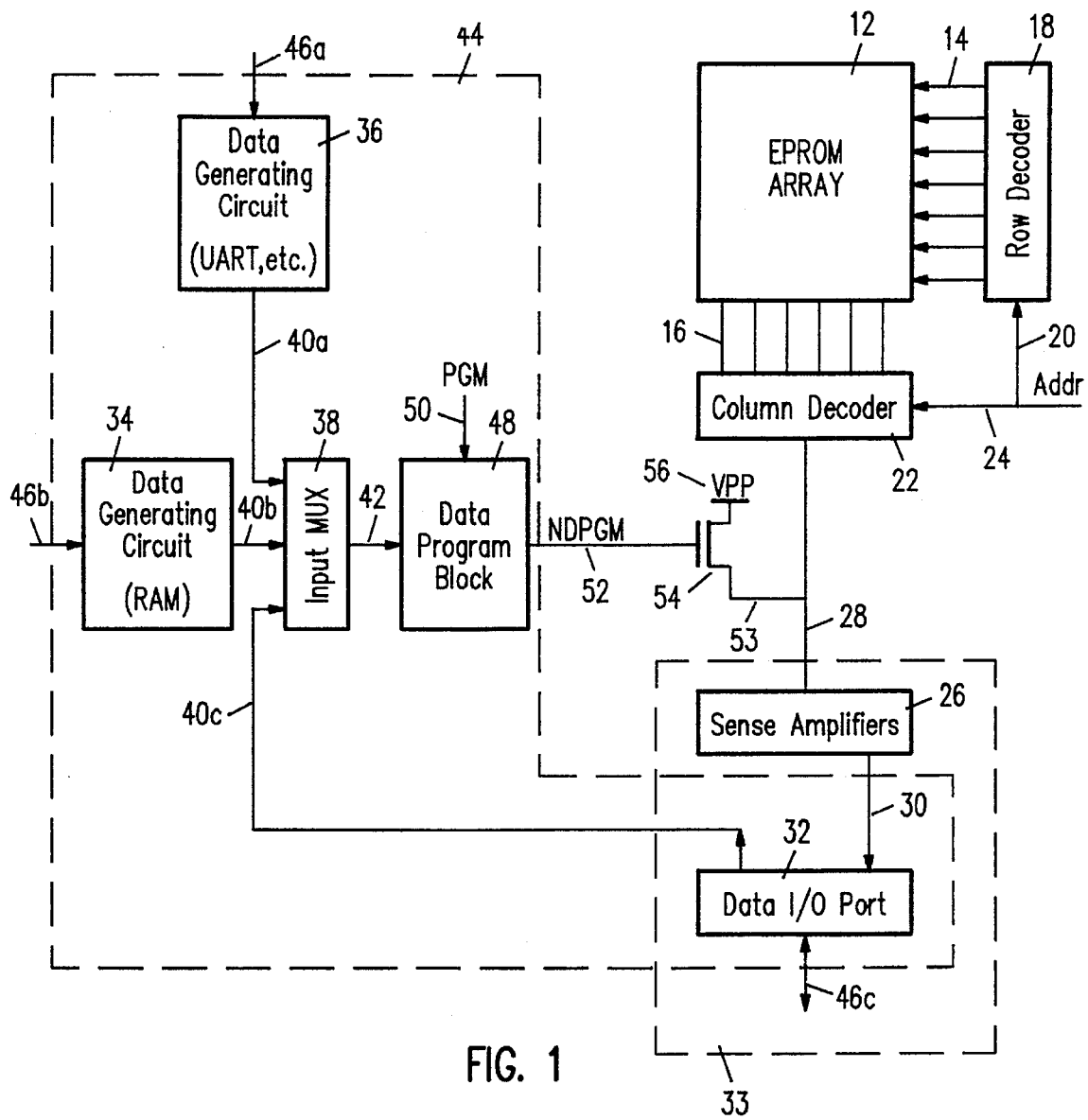
FIG. 1 is a block diagram of a previous EPROM array and I/O circuit.

FIG. 1 depicts an EPROM array and associated circuitry according to previously provided devices. The memory device depicted in FIG. 1 includes an array 12 made up of a plurality of individual memory elements (not shown). Different types of EPROM arrays can be used including arrays such as those depicted in co-pending application Ser. No. 07/856,004 for "Fault Locator Architecture and Method for Memories," incorporated herein by reference to the extent needed for understanding the present invention. The memory elements in the array 12 are arranged in rows and columns with the elements in a row being connected by one of a plurality of row lines 14 and the elements in a column being connected by one of a plurality of column lines 16. A row line 14 and a column line 16 are selected by row and column decoders, respectively, making use of the memory cell address applied. Certain voltage levels are applied to the selected column and selected row. In a typical EPROM array, a cell of the array 12 can be selected for reading by placing a first, relatively low voltage (e.g., about 2 volts on a column line, and $V_{cc}$ on a row line) on the corresponding row line and column line 14, 16, and can be write-selected (so as to permit programming or writing to the cell) by placing a second, typically higher voltage (much higher than $V_{cc}$) on a selected row and column, the magnitudes of row and column voltages depending on the EPROM cell implementation. The voltages on the selected column and row during write, while much higher than $V_{cc}$, could differ in magnitude. In one embodiment, $V_{pp}$ can be used as the high voltage applied to the selected column when the EPROM cell being addressed is to be programmed. In this embodiment, $V_{ppp}$ can be used as the high voltage applied on the selected row during WRITE active.

Figure 2:
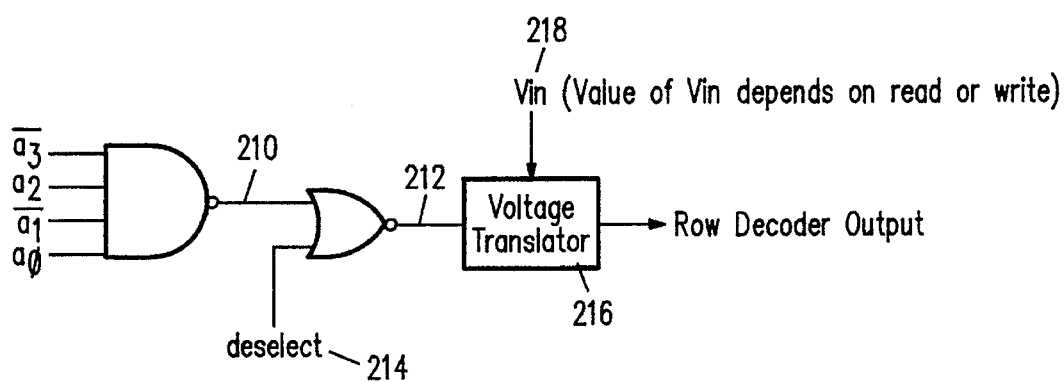
FIG. 2 is a schematic diagram of a deselecting device.

A row line 14 is selected by a row decoder 18 in response to input of an address over an address line 20 in a manner well-known in the art. Similarly, a column line 16 is selected by a column decoder 22 in response to input of an address over an address line 24. Additionally, in many EPROM devices, it is possible to force all of the rows 14 to be simultaneously deselected, as is well-known in the art. A number of devices can be used for deselecting. FIG. 2 schematically depicts a device which can be used for this purpose. Suppose the array under consideration has 4 address bits for row selection: a3, a2, a1, a0. FIG. 2 shows the section of the row decoder which selects the row with address a3a2a1a0=0101. Node 210 will be 0 when the address is 0101. If the deselect signal is inactive (0, in this example), node 212 will be 1. The voltage translator 216 is a circuit which outputs $V_{in}$ 218 when node 212 is high, and outputs 0 when node 212 is low. If the deselect signal 214 is high, node 212 will be 0, regardless of the level at node 210. So, the row decoder output will be low. Thus, the deselect signal 214 deactivates all row lines. Usually in large arrays with multiple level decoding, the deselect signal 214 is used with predecoders to deactivate all predecoder outputs, thereby deselecting all the rows. If all of the row lines 14 of the array 12 are deselected, it will be impossible to write or read any cell in the array 12.

The column decoder 22 is connected to sense amplifiers 26 by a bitline 28. The sense amplifiers 26 are configured (in a manner well-known in the art) to determine whether or not the bitline 28 has been connected to a ground voltage, e.g., through a turned-on unprogrammed EPROM cell. This permits the evaluation of data stored in the array 12 in the following fashion. Each cell in the array 12 can be in either a programmed state or an unprogrammed state. When a row line 14 is selected for reading, all unprogrammed cells in that row provide a low resistance pathway between the corresponding column line 16 and a ground voltage level. When a column line 16 is selected, that column line is connected to the bitline 28. Thus, when a given column line is selected, and a given row line is selected for reading, the cell which is at the intersection of the row line and the column line will either provide the column line 16, and thus the bitline 28, a low resistance path to ground (if the cell is unprogrammed) or there will be no low resistance pathway of that column line (and thus the bitline 28) to ground (if the cell is programmed). The sense amplifier 26 determines whether the line 28 is connected to ground through a low resistance path and thus determines whether the selected cell is programmed or unprogrammed. The sense amplifier outputs this information over output line 30. The data from the output line 30 can be sent to a number of locations including a data I/O port 32, a data bus, and the like, as is well-known in the art.

The circuitry depicted in FIG. 1 can also be used to write data to the EPROM array. Data that is to be written to the EPROM array can be provided from a number of data sources including on-chip data generating circuits such as random access memory (RAM) 34 or universal asynchronous receiver-transmitter (UART) 36 or the data I/O port 32.

Other data sources (on-chip or off-chip) for providing data, for example, ROM and various registers can also be used, as is well-known in the art.

A circuit can be provided for selecting which of the various possible data sources will be used as the data source for writing to the array 12. One such data selection circuit is a multiplexor 38. The multiplexor receives input over a plurality of lines 40a, 40b, 40c and selects one of these sources, in response to a control signal (not shown) to be output over an output line 42.

Figure 9:
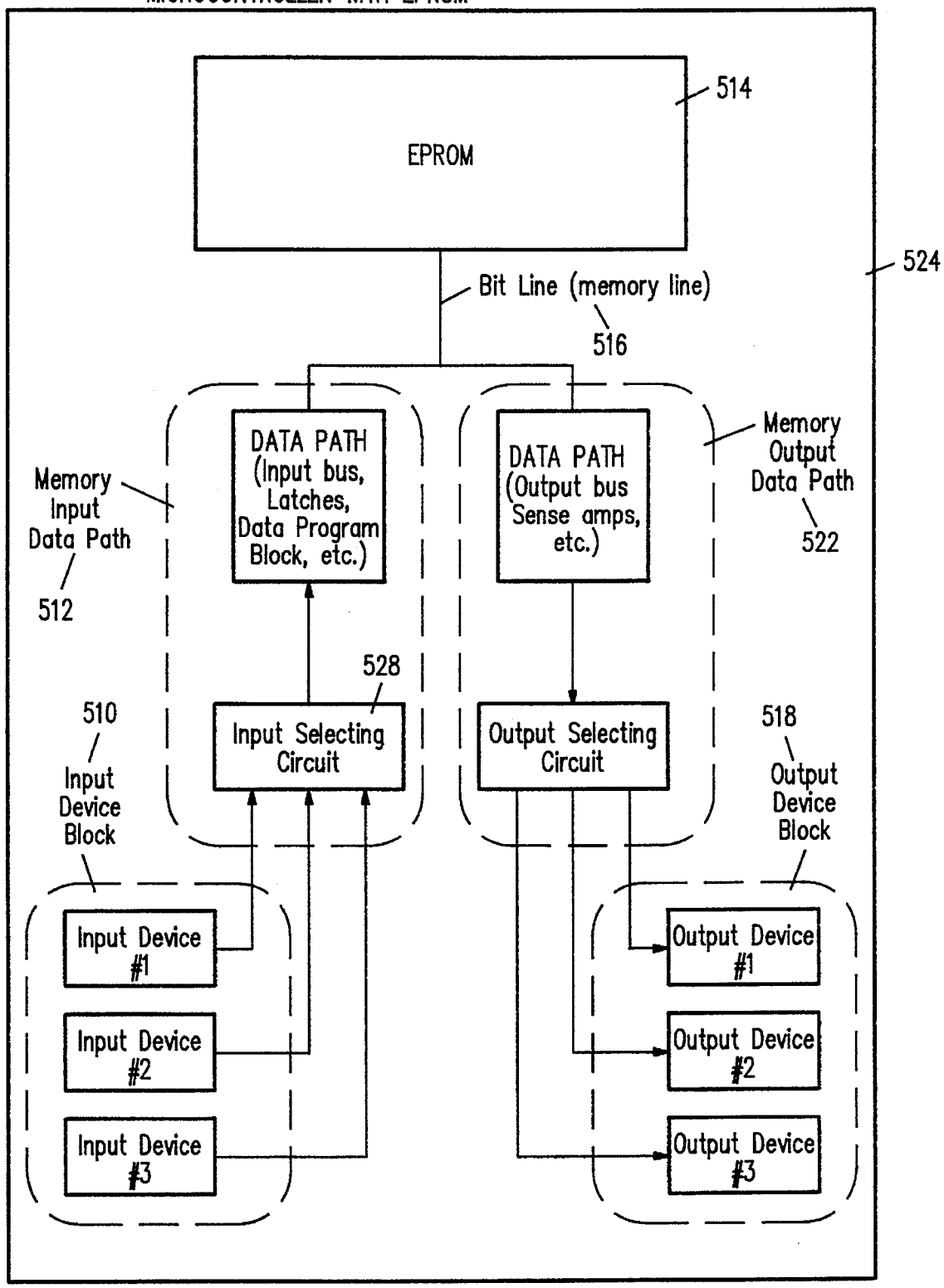
FIG. 9 is a block diagram showing input and output device blocks and memory input and output datapaths in a microcontroller with EPROM.

In the embodiment depicted in FIG. 1, the data sources 32, 34, 36 constitute Input Device Block 510 (FIG. 9). The input mux 38, Data Program Block 48, and Datapaths 40a, 40b, 40c, 42 constitute memory input datapath 512 for the EPROM array 12. Circuitry 44 contains the Input Device Block and Memory Input Datapath. Other types of circuitry can also be used for input to the EPROM array 12, as is well-known in the art, provided circuitry 44 is configured to provide data which can be used for writing to the array 12. The input device block 510 receives data on input lines 46a, 46b, 46c. 42 carries the data from the source selecting circuit 528 (in this case, a multiplexor) to Data Program block 48. The data intended to be carried (in the absence of faults) by 42, in response to the input 46 to the selected input device, needs to be known. During the test mode (FIG. 4) in response to the data carried by 42, output circuit 33 will output the data on the bidirectional line 46c. The present invention permits detection of malfunction of the input circuit 44, and output circuit 33 by checking for the desired relationship between input 46 and output 46c.

The Data Program Block receives data from the multiplexor 38, over line 42, and also receives a program (PGM) control signal 50. The source of the program control signal can be from a number of well-known sources such as directly from a microprocessor (such as over a control bus) from a memory control unit and the like. As explained more fully below, when the PGM signal is inactive, data provided over line 42 does not affect the output by the Data Program Block 48. However, when the PGM signal is in an active state, data which is input to the Data Program Block 48 determines the output over the line 52 (designated "NDPGM" in FIG. 3). The data output of the NDPGM line 52 is operative to place a high (write select) voltage on the bitline 28. In the embodiment shown in FIG. 1, this is achieved by using the NDPGM signal 52 to control the gate of a transistor 54. The source-drain line of the transistor 54 controllably connects the bitline 28 to a source of high voltage $V_{PP}$ 56. Thus, when a "high" or "one" data bit is provided over the NDPGM line 52, the transistor 54 is placed in a turned-on (low resistance) state thus connecting the high voltage source 56 to the bitline 28.

When the bitline 28 has a high voltage source connected to it, it is possible to write data into the EPROM array 12 in the following manner. As noted above, in order to write to a cell in the EPROM array 12 both the corresponding row line and column line for that cell must be write selected, i.e., must have a high voltage connected thereto. The row decoder is capable of providing a high voltage $V_{PPP}$ to corresponding row in response to provision of an address over address line 20 in a manner well-known in the art. The column decoder is capable of connecting one of the column lines 16 to the bitline 28. Thus, when a column line 16 is provided to bitline 28 during a time when the bitline 28 is connected to the high voltage source 56, the column line 16 will be write-selected.

In the embodiment depicted in FIG. 1, it is infeasible to test the relationship of input 44 to output 46c of the output circuitry 33 without writing to EPROM cells. This is because sense amp 26 needs to access an EPROM cell through its bitline to read the data, and this is possible only if the data is written to the cells. Such writing to the EPROM array is undesirable for the reasons described above.

Figure 3:
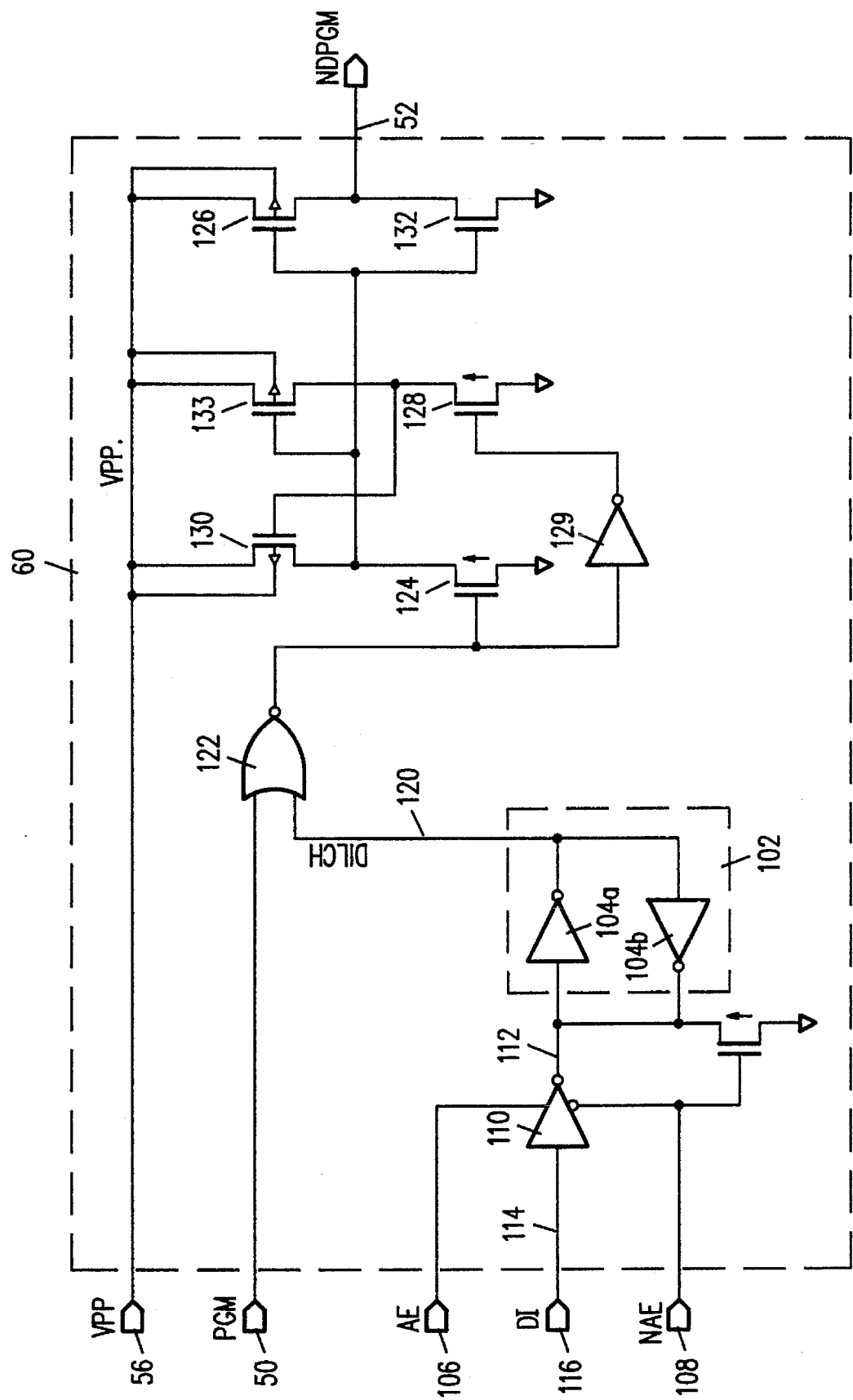
FIG. 3 is a schematic diagram of a Data Program Block.

FIG. 3 depicts, in greater detail, the Data Program Block 48 of FIG. 1. Each bitline of the EPROM will have its own Data Program Block 48. For example, in a 4K×8 bit EPROM, there will be eight bitlines, each connected to a Data Program Block 48. A number of types of circuitry can be used as a Data Program Block. One circuit which is operable for this purpose is depicted in FIG. 3. The output of this circuit generates a high voltage programming pulse at line 53 if the data bit present in the data latch 102, formed by two inverters 104a, 104b is a binary "low" or "zero. Other control signals, power signals, and the like will also be provided to the Data Program Block, as described more fully below. During normal operation of the chip, when the data needs to be written or read, two control signals (designated "AE" and "NAE" in FIG. 3) will be active. Signal AE is active-high or "1" and signal NAE is active-low or "0" 106, 108. These signals control a tri-inventer 110. The tri-inverter 110 operates such that when signal AE is active, the output 112 is the complement of the input 114. When signal AE is non-active, the output 112 is floating. Thus, when signal AE 106 is active, data on the data input pins provided to the data input line 116 will be gated, via line 112, into the data latch 102. In order to effect a write of data to the EPROM 12, a write control signal or write pulse (WR) will be provided over a control line. A WRITE pin on the chip is a very common source for a write control signal for programming the EPROM (stand alone EPROM or EPROM on microcontroller) by an EPROM programmer. For run-time programming, other sources (e.g., internally generated or externally provided write control signals) are used.

Figure 7A:
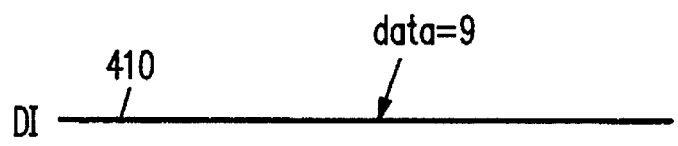
FIGS. 7A–7D shows the timing relationship of signals in the write generator of FIG. 3, for a zero data bit.
Figure 7B:
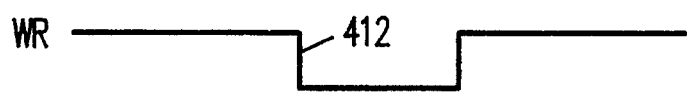
Figure 7C:
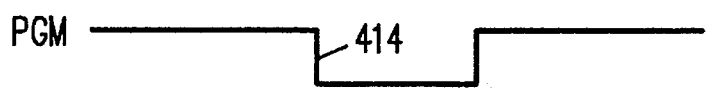
Figure 7D:
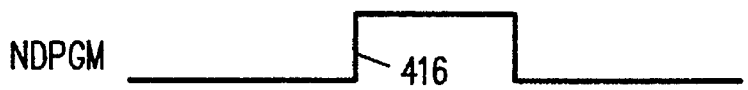
Figure 8A:
FIGS. 8A–8D shows the timing relationship of signals in the write generator of FIG. 3 for a one data bit.
Figure 8B:
Figure 8C:
Figure 8D:
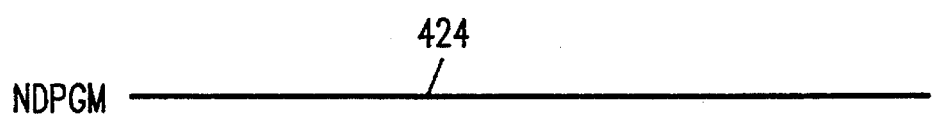

FIG. 7A–7D depict the relationship of signals in the case where the data bit 410 is "0" or "low". During the duration of the write pulse (shown as active low), the program (PGM) signal 50 (414 in FIG. 7) will be in a low or "0" state. In the depicted configuration, both WR 412 and PGM 414 are active low signals. This relationship is depicted in FIGS. 7A and 7C. During this duration, the data which is in the data latch 102 will determine the state of the output signal 52 (416 in FIG. 7) If the input data DI 410 is "0" as depicted in FIGS. 7A, the data contained in an output from the data latch 102 provided over line DILCH 120 will be low or "0". Since signal PGM 414 is "0" during a write, the output of the NOR gate 122 will be high or "1". As a result, the N-channel transistor 124 is placed in a turned-on state. As a result, both p-channel transistors 126, 133 are turned on. In this case, p-channel transistor 133 enables turning off of p-channel transistor 130. In response, the P channel transistor 126 is also placed in a turned-on state. This results in the voltage source $V_{ppp}$ being conveyed to line 52, and $V_{pp}$ being conveyed to line 53 during the write pulse. The NDPGM signal 416 (52 in FIG. 1 and 3) controls the gate of transistor 54 (as shown in FIG. 1) to provide a high voltage $V_{pp}$ via lines 53 and 28 to the drain of the EPROM cell being written to.

If data 418 input over line 116 and placed in the latch 102 is "high" or "1" as depicted in FIG. 8A–8D, the output of the NOR gate 122 during the WR pulse 420, will be zero. This results in the N channel transistor 128 being placed in a turned-on state, by the operation of the inverter 129. In consequence, the P channel transistor 130 is placed in a turned-on state, turning on N-channel transistor 132, and turning off P-channel transistor 133. Because transistor 132 is in a turned-on state, signal NDPGM 424 (52 in FIGS. 1 and 3) is in a low or "0" state. This turns off the transistor 54 preventing $V_{pp}$ from reaching the drain of the selected EPROM cell.

Figure 4:
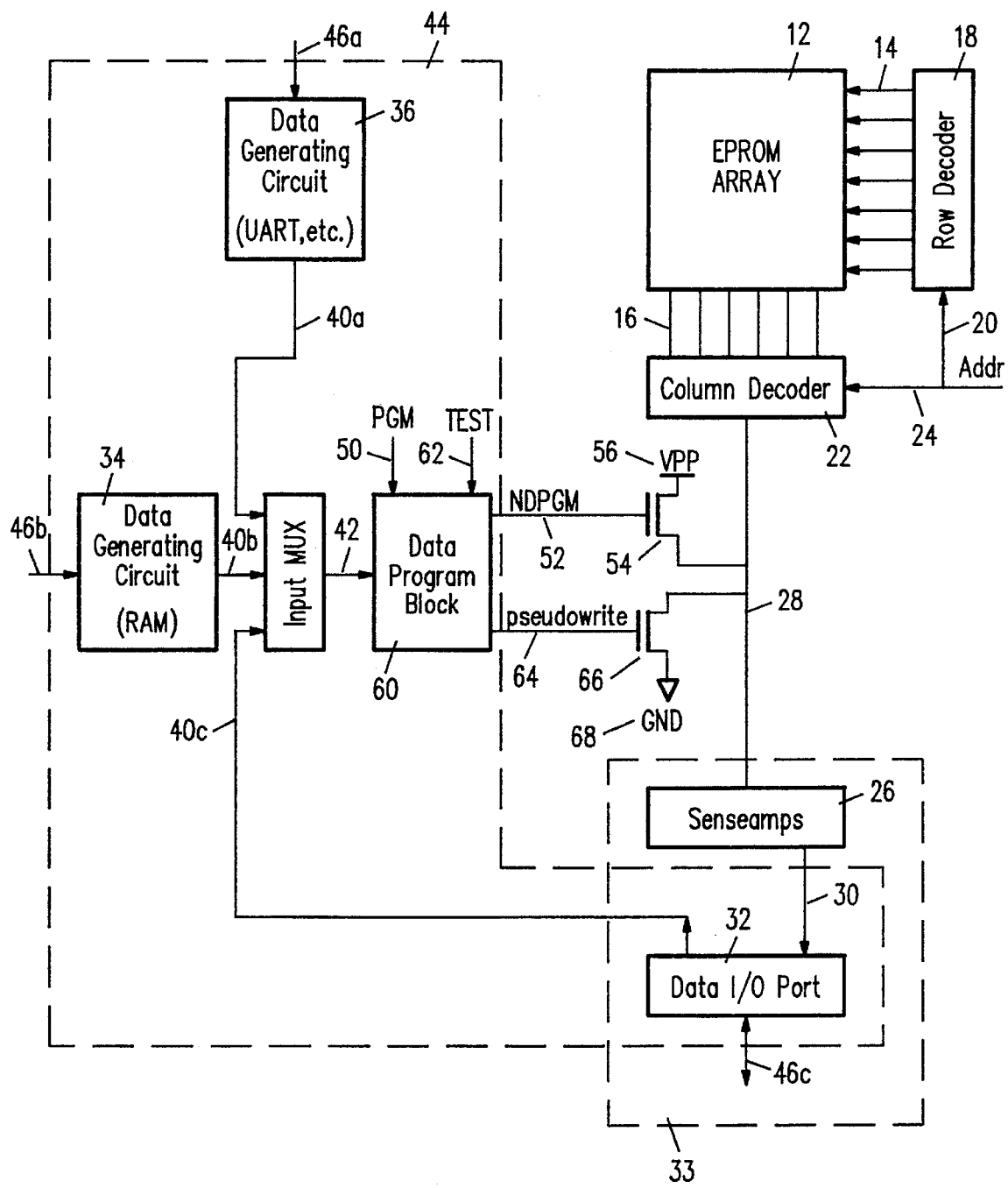
FIG. 4 is a block diagram of an EPROM array and I/O circuit and test device according to the present invention.

FIG. 4 shows circuitry which can be used for checking the input circuitry 44 and output circuitry 33 according to one embodiment of the invention. In the embodiment of FIG. 4, a different Data Program Block 60 is provided. The Data Program Block 60 receives data over a line 42 and receives at least two control signals, a PGM signal 50 and a test signal 62. When the TEST signal 62 is active (high), Data Program Block 60 is configured in test mode. In the test mode, Data Program block 60 controls "pseudo-write" line 64. It is preferred to keep NDPGM inactive during test mode, even though the rows have been deselected. This presents to the sense amp a situation similar to a normal read, where the bitline either floats or is grounded (in either case, the bitline is not connected to $V_{pp}$). When test 62 is active or "1," output of the NOR gate 122 of FIG. 5 will be "0" resulting in NDPGM being inactive, turning off the N-channel transistor 54. When the chip is not in the test mode, test 62 will be "0" and DILCH input 120 will decide the level of NDPGM, when PGM is active ("0").

The pseudo-write line 64 is connected to the gate of a transistor such as N- channel transistor 66. The source-drain line of the transistor 66 selectably couples the bitline 28 to a ground voltage source 68. In the embodiment of FIG. 4, a "high" signal on pseudo-write line operates to pull down the bitline 28. Pulling down line 28 effectively simulates what would happen to line 28 if it were connected to a selected EPROM cell 12 which was in an unprogrammed or erased state. When pseudo-write line 64 is in a low or inactive state, bitline 28 is allowed to float, simulating the state line 28 would be in if it were connected to a selected EPROM bit which was in a programmed or written state.

Figure 5:
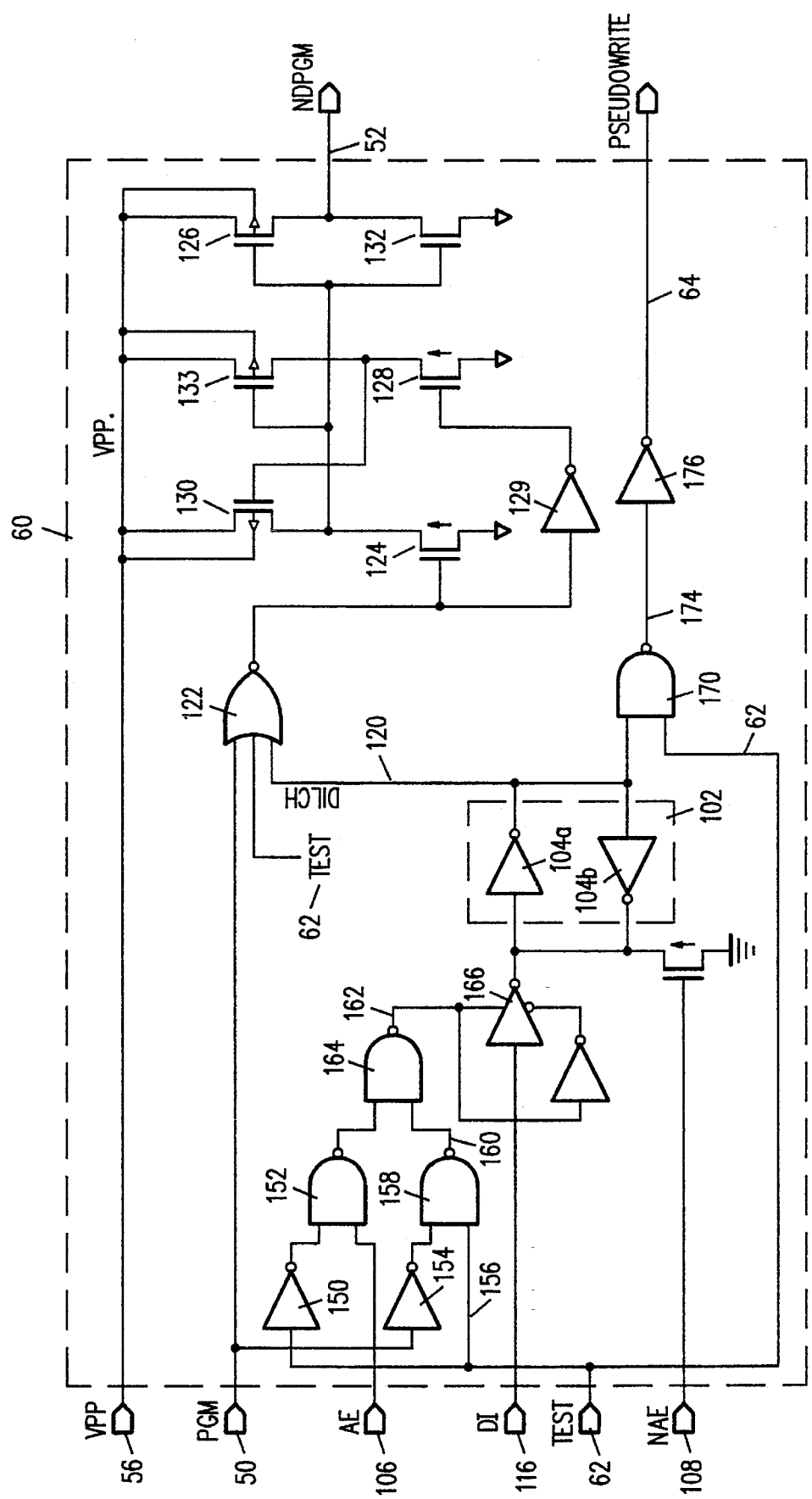
FIG. 5 is a schematic diagram of a Data Program Block including test circuitry according to the present invention.

FIG. 5 depicts a Data Program Block 60 according to one embodiment of the present invention, in greater detail. There are a number of ways in which a Data Program Block can be configured to provide the above-described functions. The circuitry of FIG. 5 depicts one such implementation. During this test, an input pin is used to put the chip in test mode. Any unused pin during this test mode can be made use of for this purpose. For example, a row or column address pin can be used for this purpose. During the duration of this test, an address needs to be applied at the address pins. The actual value of the address is not important. An address pin can be provided with high voltage decode to put the chip in this test mode. A common high voltage decode is discussed in co-pending application Ser. No. 07/856,004 for "FAULT LOCATOR ARCHITECTURE AND METHOD FOR MEMORIES"). If the high voltage decode on the chosen pin produces an active high signal TEST 62, when "High Voltage" level is applied on this pin, the chip enters test mode when TEST becomes "1." The output of inverter 150 will thus be low and the output of NAND gate 152 will accordingly be high. Invertor 154 will output a signal which is the opposite of the PGM signal 50 and, since signal on line 156 is high, the output of NAND gate 158 will be high if, and only if, PGM signal 50 is high. As noted above, during a write pulse, signal PGM 50 is low. Thus, the output 160 from NAND gate 158 will be low causing the output 162 from NAND gate 164 to be high. This causes the tri-state invertor 166 to be placed in a state wherein input data received over line 116 is transmitted to the data latch 102. Thus, data received over line 116 will form one of the inputs to the NAND gate 170. The other input to the NAND gate 170, which is TEST 62 will be active (high or "1") during the test. In consequence, the output 174 from NAND gate 170 will be the inverse of data received on line 116. Invertor 176 causes the pseudo-write line 64 to have the same binary value as the data input over line 116. Thus, during the test mode, when test signal 62 is in the active state, pseudo-write signal 64 will be in the high or "1" state if the data bit received over line 116 is in the high or "1" state and will be in the "0" or low state if the data received over line 116 is in the "0" or low state.

After the WR pulse returns to a non-active level, the PGM signal 50 becomes inactive or high. This causes the output 160 from NAND gate 158 to be high and causes the output 162 from NAND gate 164 to be low. When the output 162 is low, the tri-invertor 166 is placed in a state such that its output is floating. Data latched in the data latch 102 during the write pulse is thus maintained in the data latch 102. For this reason, even after the PGM signal 50 returns to the high state, the pseudo-write signal 64 will stay in the same state it was in during the WR pulse. According to one embodiment of the present invention, the same set of pins are used for data input and output from the EPROM array. This means data pins are bidirectional pins, so input data needs to be removed and the data pins need to be configured as output pins in order to read the data from the EPROM array.

For example, consider the case where the default state of the data pins are as input pins, and Output Enable (OE) on the OE pin, when it goes active, configures data pins as output pins. As depicted in FIGS. 6A–6E, the test mode selecting signal level is applied to the selected pin to activate TEST signal 310. Then the address is applied 312. Then the data is applied to the data pins 314. Then the WR pulse is applied 316. The data latches in FIG. 5 receive data. The bitlines are allowed to float or are grounded, depending on this data. Now the data input is removed from the data pins 318. Data stored in the latches of FIG. 5 still keep the bitlines in the states corresponding to the data input. Now, OE goes active 320, which reconfigures the data pins as output pins and outputs the state of the bitlines, as in a normal read situation.

Many variations to the disclosed architectures can exist and different implementation of test logic can exist. For example, input pins need not be the same as output pins. In that case, OE can be permanently enabled during the test mode to read the input data continuously. In some other cases, the default mode of data pins could be output.

When a "high" or "one" bit is output over the pseudo-write line 64, the transistor 66 is turned on, thus connecting the bitline 28 to a ground voltage 68. When a low or "zero" data bit is output on the pseudo-write line 64, the transistor 66 is turned off and the bitline 28 is not coupled to ground 68. Since the sense amp 26 can determine whether the bitline 28 is coupled to ground, the sense amp 26 can be used for evaluating the data output on pseudo-write line 64. Sense amp 26 outputs the sensed data on line 30 to data I/O port 32. Data from the Data I/O Port can be read from line 46c. In this way, the present invention makes it possible to compare, for a given input, expected output data to the observed output data, to make a determination whether the input and output circuits are working as intended. The data which is output by the Data I/O port 32, can be sent to a printer or a display device for manual comparison with the expected data, or can be output to electronics for automatic comparison with the expected data, or can be sent to memory for storage and later evaluation. In this way, the present invention makes it possible to compare the data output from the write-signal generator 60 with the data input to the input circuit 44 without writing the data to the EPROM array 12. The data which is output can be sent to memory for storage and later evaluation, can be sent to an I/O device for display or printing or can be sent to electronics for automatic comparison of the output data which was input to the circuit 44. In production test applications, in many instances data could be evaluated using general typical production IC test equipment, (such as devices manufactured by GENRAD, Q2, or Trillium).

During a test, circuitry of FIG. 4 permits tests on input/output circuitry to be conducted without writing of the data to the EPROM cells. To prevent writing of the data during a test, Data Program Block 60 keeps NDPGM at the inactive state ("0" or low) when the TEST 62 is active (high or "1"). This prevents $V_{pp}$ from being applied to the selected column line. Also, during test, the presence of the unprogrammed cells in EPROM array 12 connected to the selected column line, should not interfere with the outcome of the test. In order to achieve this, all the rows in the EPROM array 12 are deselected using row deselect signal described previously. The row deselect signal can be asserted externally (for example, using a predetermined address pin with high voltage decode) or can be asserted using TEST 62 such that all the row lines 14 are automatically deselected whenever the TEST 62 is asserted.

The device depicted in FIG. 4 is preferably included in a device packaged to have a number of pins for data input/output. The pins include input/output pins such as row address pins, column address pins, data pins and operational pins such as power supply pins, clock pins, select pins, control pins and the like. In one embodiment, implemented in EPROM chips, the present invention is preferably socket-compatible with previous EPROM devices. However, because additional signals are needed for conducting the tests, in order to maintain socket-compatibility, some of the pins may be used for more than one function. According to one embodiment of the invention, the "test" signal generating pin is the only additional pin which needs to be made this type, for the purpose of implementing this methodology. The multi-functionality of the pins is achieved by providing signal levels on the pins at different voltage levels for the different functions and providing a discriminator device which can discriminate among the various voltage levels. For example, in one embodiment, in order to enter the test mode, one or more address pins can be used connected to a high voltage decode or discriminator circuit. When the test mode is active, a pulse on the write pin (not to be confused with the write line 52) will result in a pseudo-programming pulse (PGM) which will not actually program the cell being addressed.

In view of the above-description, a number of advantages of the present invention can be seen. The present invention permits testing of input (input device block and memory input datapath) and output (output device block and memory output datapath) without writing data to an EPROM array. Because data is not written to the EPROM array, the number of test cells (in the case of packaged OTP EPROMs), or size of the normal array (in the case of erasable parts) do not limit the number of test patterns for testing input and output. Furthermore, the test is repeatable, in particular can be repeated without the need for erasing data from the EPROM array 12. The EPROM array 12 does not need to be provided with extra memory cells (i.e., memory cells which are used only for test purposes and are not used during normal operation of the EPROM array) for I/O functional tests which can be conducted using the new methodology. The present invention uses a device already present for another purpose (e.g., sense amps) in order to evaluate the pseudo-write signal. Thus, by using one device (e.g., the sense amp) for two purposes (e.g., evaluating memory cells during a read operation and evaluating a pseudo-write signal during a test operation) testability improvement can be attained without incurring silicon area penalties associated with test cells.

Because, for different input patterns to the input device block, data output from the output device block is compared to the data output expected when the chip is working fault-free, comparison will reveal faults which occur in input or output affecting the data.

A number of variations and modifications of the present invention can be used. The present invention can be used in connection with the I/O circuits other than those depicted. It is possible to use certain aspects of the present invention without using other aspects. For example, it is possible to provide a Data Program Block that outputs a pseudo-write signal 64 without using the sense amp 26 for evaluation of the pseudo-write signal 64. As will be apparent to those skilled in the art, circuitry other than that depicted can be used to achieve the functionality described. For example, a different gate mix can be used to generate the logic for implementation of the test. The testing part of the scheme could be used in devices other than OTP EPROMs. The described apparatus and method could be used in connection with windowed EPROMs, for example, in order to avoid the need for lengthy erasing after a test procedure. Since this methodology provides tests for input and output of EPROMs (Erasable Programmable Read Only Memory) without writing to the EPROM array, this invention can have a positive economic impact, by saving erasure time. But it is expected that the most significant impact will be on OTP EPROMs (One Time Programmable Erasable Programmable Read Only Memory) which, despite the name, are not erasable. Although it is believed there is no current economic need for the invention in context other than an EPROM, at least some aspects of the invention could theoretically be applied to other types of memory such as EEPROMS, and possibly to other types of array devices such as non-erasable PROMs. Rather than providing a write signal and a pseudo-write signal on two different output lines, it is possible to provide the write signal and pseudo-write signal on the same output line with additional circuitry for determining whether that output signal line selectively connects the line 28 to VPP (in the case of a write) or to ground (in the case of pseudo-write). Although it is believed using the sense amp 26 to evaluate the pseudo-write signal 64 is advantageous in that additional circuitry is avoided and the sense amp which is part of the output circuit is tested, it is also possible to use a circuit for evaluating the pseudo-write output line 64 which is separate from the sense amp 26. Although, in the preferred embodiment, a WRITE pin is used during the test, to generate pseudo-programming signal PGM, if there is another suitable pin such as Chip Select, such a pin, when available, could be used for this purpose, using simple circuit modifications.

Although the invention has been described by way of a preferred embodiment in certain variations and modifications, other variations and modifications can also be used, the invention being defined by the following claims.

What is claimed is:

1. Apparatus for receiving data from any of a plurality of data sources and having capability for testing data input and output circuitry, and having the capability of retrievably storing data in an EPROM and for outputting data to any of a plurality of output devices, the input circuitry being circuitry for providing data from at least one of said plurality of data sources to said EPROM for writing data in said EPROM, the output circuitry for providing data read from the EPROM to at least one of said plurality of output devices, said EPROM having a plurality of normally-used, selectable and deselectable memory elements organized in rows and columns, said input and output circuitry including circuitry for receiving first data from at least one of said plurality of data sources and for outputting second data, in response to input of said first data, the apparatus comprising:

first means for deselecting all rows of said normally-used memory elements in said EPROM;

testing means, coupled to said input and output circuitry for receiving said second data;

second means, in said testing means, for outputting said second data on at least a first bitline, without writing said second data to said EPROM and without reading any of said memory elements;

third means for evaluating the data on said bitline without reading any of said memory elements to permit comparing said evaluated data to said first data to check for desired functioning of said input and output circuitry.

2. Apparatus, as claimed in claim 1, wherein said second data is identical to said first data.

3. In a circuit which includes an erasable programmable read only memory, said memory including a plurality of memory elements arranged in a plurality of rows and columns, elements in each row connected to a row line, elements in each column connected to a column line, a row decoder coupled to each of said rows for controllably selecting at least one row by placing a predetermined voltage on said row line, a column decoder coupled to each of said columns for controllably selecting at least one column by connecting a column line to a bitline, at least a first of said plurality of memory elements being programmable in response to receiving data-dependent predetermined voltage when the corresponding column line and row line are both selected, said circuit also including input-output circuitry, including first circuitry for receiving data to be written to said memory for programming of said memory and second circuitry for supplying said data to said bitline, apparatus including a device for testing said input-output circuitry without writing data to said memory, the apparatus comprising:

a plurality of logic gates, coupled to said first circuitry, and configured to receive said data from said first circuitry and coupled to receive a test signal, and having an output coupled to said bitline to output said data to said bitline for writing when said test signal is in a first binary state and to disable reading and writing of said plurality of memory elements and to control a third circuit when said test signal is in a second binary state, said third circuit being configured to connect said bitline to a ground voltage level only when said data is in a first binary state, without reading any of said plurality of memory elements; and circuitry, coupled to said bitline, for evaluating whether said bitline has been coupled to a ground voltage without reading any of said plurality of memory elements.

4. A method for testing an input-output circuit which is coupled to an EPROM, the input-output circuit for providing data from at least one of a plurality of data sources for writing to said EPROM, the method comprising:

a) deselecting all memory elements in said EPROM;

b) providing predetermined first test data from at least one of said plurality of data sources;

c) receiving said first data in a second circuit;

d) using said second circuit to provide second data to testing circuitry, in response to input of said first data;

e) using said testing circuitry to output said second data on at least a first bitline, without writing said second data to said EPROM and without reading data from said EPROM;

f) evaluating data on said bitline and comparing said evaluated second data to said first data without reading data from said EPROM to check for desired functioning of said input-output circuit.

5. A method, as claimed in claim 4, wherein said EPROM includes a plurality of selectable rows and wherein said step of deselecting includes deselecting all rows of said EPROM.

6. A method, as claimed in claim 4, wherein said EPROM includes a sense amp that operates to evaluate data stored in said EPROM and wherein said step of evaluating includes using said sense amp to evaluate said second data.

7. A method, as claimed in claim 4, further comprising the step of:

repeating the testing of said input-output devices by repeating steps a) through f), without first erasing data stored in said EPROM.

8. An apparatus for testing input/output in a memory device having a plurality of memory elements, said memory device having a device input circuit and a device output circuit, the apparatus comprising:

a first circuitry, located in said input circuit, and including:
 (a) a first input of said first circuitry coupled to receive data;
 (b) a second input of said first circuitry input coupled to receive a test signal;
 (c) a third input of said first circuitry coupled to receive a write signal;
 (d) a first output of said first circuitry coupled to a bitline of said memory and adapted to output said receive data to said bitline for writing to said memory when said write signal is asserted and said test signal is deasserted;
 (e) a second output of said first circuitry coupled to said bitline of said memory and adapted to deselect all of said plurality of memory elements and adapted to output said receive data to said bitline in the absence of reading the contents of any of said memory elements, and adapted to prevent writing said receive data to said memory when said test signal is asserted; and a second circuitry, located in said device output circuit and coupled to said bitline, and adapted to evaluate data on said bitline in the absence of reading the contents of any of said memory elements.

9. Apparatus as claimed in claim 8 wherein said second circuitry comprises at least one sense amp.

10. Apparatus as claimed in claim 9 wherein said sense amp is coupled to said memory for evaluating data stored in said memory.

11. Apparatus as claimed in claim 8 wherein said memory is erasable programmable read only memory.

12. Apparatus as claimed in claim 11 wherein said memory is one time programmable erasable programmable read only memory.

13. Apparatus as claimed in claim 11 wherein said apparatus includes a microcontroller.

14. Apparatus as claimed in claim 8 wherein said data includes at least one bit which can be in one of two data-signal binary states and further comprising a third circuitry for coupling said bitline to ground voltage only when said data bit is in said first data-signal binary state and said test-signal is asserted.

* * * * *